United States Patent [19]

Jansen et al.

[11] Patent Number: 4,466,380
[45] Date of Patent: Aug. 21, 1984

[54] PLASMA DEPOSITION APPARATUS FOR PHOTOCONDUCTIVE DRUMS

[75] Inventors: Frank Jansen, Walworth; Joseph Mort, Webster, both of N.Y.

[73] Assignee: Xerox Corporation, Stamford, Conn.

[21] Appl. No.: 456,935

[22] Filed: Jan. 10, 1983

[51] Int. Cl.³ .......................................... C23C 13/08
[52] U.S. Cl. .................................. 118/712; 118/723; 118/730; 118/725; 118/900; 427/39; 118/692
[58] Field of Search ...................... 118/723, 50.1, 730, 118/900, 725, 689, 692, 715, 712; 427/38, 39, 74, 76

[56] References Cited

U.S. PATENT DOCUMENTS

| | | | |
|---|---|---|---|
| 3,886,896 | 6/1975 | Van Cakenberghe | 118/49.1 |
| 4,080,281 | 3/1978 | Endo | 118/730 X |
| 4,225,222 | 9/1980 | Kempter | 427/39 X |
| 4,265,991 | 5/1981 | Hirai et al. | 430/64 |
| 4,282,267 | 8/1981 | Küyel | 427/38 |
| 4,394,426 | 7/1983 | Shimizu et al. | 430/66 X |

FOREIGN PATENT DOCUMENTS

| | | | |
|---|---|---|---|
| 2490246 | 3/1982 | France | 118/715 |
| 146964 | 3/1981 | German Democratic Rep. | 118/50.1 |
| 301677 | 5/1971 | U.S.S.R. | 118/715 |

OTHER PUBLICATIONS

Japanese Journal of Applied Physics, vol. 20, 1981, pp. 305-310, "Electrophotographic of RF Glow Discharge-Produced A Si:H Film".

Photographic Science & Engineering, vol. 26, No. 3, 5-6/82, p. 148, "Design of an Amorphous Silicon P/R for Electrophotography".

Journal of Non-Crystalline Solids, 35 & 36, pp. 773-778, "A-Si Thin Film as a P/R for Electrophotography".

Primary Examiner—John D. Smith
Assistant Examiner—Bernard F. Plantz
Attorney, Agent, or Firm—E. O. Palazzo

[57] ABSTRACT

This invention is directed to an apparatus for preparing semiconducting and photoelectronic devices comprised of a first electrode means, a second counter electrode means, a receptacle means for the first electrode means and the second counter electrode means, a substrate means to be coated contained on the first electrode means, which substrate is in the form of a cylindrical member, and a gas inlet means, a gas exhaust means, wherein a silane gas is introduced into the receptacle in a crossflow direction, perpendicular to the axis of the cylindrical member.

22 Claims, 6 Drawing Figures

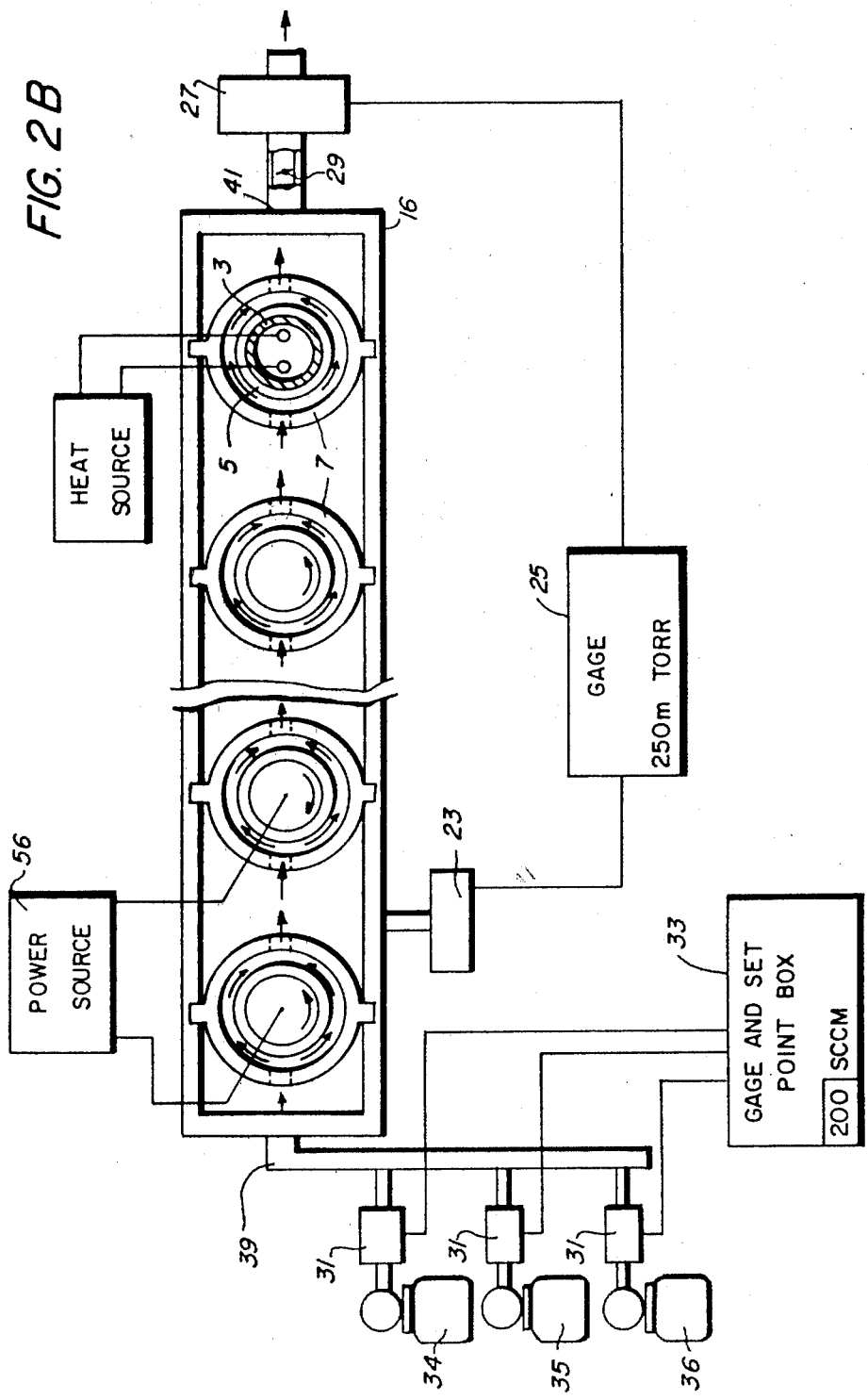

PLASMA DEPOSITION APPARATUS FOR PHOTOCONDUCTIVE DRUMS

BACKGROUND

This invention generally relates to a process and apparatus, and more specifically, the present invention is directed to a process and apparatus for preparing semiconductive devices and photoelectronic devices. In one embodiment the present invention is directed to an apparatus and process for the preparation of a photoresponsive device by the deposition of a film of amorphous silicon on a cylindrical substrate contained in a vacuum chamber, by subjecting an appropriate gas source material, such as a silane gas to decomposition in an electrical discharge subsequent to causing such a gas to flow in a crossward direction toward the cylindrical substrate or in a direction orthogonal to the cylinder substrate axis. The resulting coated substrate, which can be a drum of aluminum, containing on its surface the deposited amorphous silicon is useful as a photoconductor, or can be incorporated in a photoresponsive imaging device or photoconductor member in, for example, electrostatic imaging devices.

Electrostatographic imaging systems, particularly xerographic imaging systems are well known in the art. In these systems, generally a photoresponsive or photoconductor material is selected for forming the latent electrostatic image thereon. Examples of photoconductive materials include amorphous selenium, alloys of selenium, such as selenium tellurium, selenium arsenic, and the like. Additionally, there can be selected as the photoresponsive imaging member, various organic photoconductive materials, including for example, complexes of trinitrofluorenone and polyvinylcarbazole. Recently, there has been developed layered organic photoresponsive devices containing charge transport layers and photogenerating layers. Examples of charge transport layers include various diamines, while examples of photogenerating layers include trigonal selenium, metal and metal free phthalocyanines, vanadyl phthalocyanine, and the like.

While all of these materials are suitable for their intended purposes, there continues to be a need for improved photoreceptor members. Recently for example, there has been disclosed the use of amorphous silicon (a-Si:H) as a photoreceptor material. This material possesses a number of advantages in comparison to, for example, amorphous selenium-based materials in that amorphous silicon is of extreme hardness and will not crystallize over extended time periods, even at temperatures as high as several hundred degrees Centigrade. Additionally, amorphous silicon photoconductors have excellent photoelectric properties, high absorption coefficients through the visible region, and are relatively low in useful life cost in comparison to selenium photoconductors, for example. Moreover, amorphous silicon members are capable of ambipolarity as they can be xerographically charged and discharged either positively or negatively in various imaging systems. Further, amorphous silicon can be modified by adding various dopants thereto, such as boron and phosphorous, enabling this material to function as p or n type semiconductor devices. Also, amorphous silicon may be alloyed with other elements, such as germanium and tin for the purpose of providing a material which will be photosensitive in the infra-red region.

Amorphous silicon, which is classified as a tetrahedrally bonded amorphous semiconductor can be prepared by known thermal evaporation techniques, similar to those techniques selected for the preparation of selenium photoconductors. However, amorphous silicon prepared in accordance with such a process usually has a relatively high dark conductivity, about $10^{-3}$ ohm-cm$^{(-1)}$ thereby causing the disapearance of any charge from the surface thereof resulting in a substantially useless member for xerographic imaging purposes. Amorphous silicon prepared by the glow discharge of the gas silane results in a material having a much lower conductivity, such as below $10^{-9}$ ohm-cm$^{(-1)}$ reference, for example, the *Journal of Electrochemical Society*, Volume 116, page 77, (1969) Chittick et al., and the *Journal of Noncrystalline Solids*, Volume 3, pages 255–270, (1970) Chittick et al. Apparently, in these processes hydrogen atoms saturate dangling silicon bonds and remove the band gap states causing the Fermi level to move towards mid-gap.

It is believed that the dangling bonds intrinsically incorporated in amorphous silicon can be reduced, and to some extend controlled by the choice of film deposition conditions. These dangling bonds are apparently present in a density of sufficient magnitude to render films of amorphous silicon prepared by thermal evaporation techniques or sputtering processes unsuitable for semiconductor and photoelectronic purposes. For example, the resulting material cannot be successfully doped and used to produce p or n type operative devices. Further, intrinsic dangling bonds function as recombination sites, rendering the resulting film substantially useless for photoelectronic devices. In those situations wherein, for example, amorphous silicon films are prepared in the presence of a reactive gas, the undesirable localized states are removed from the band gap as a result of the intrinsic dangling bond defects being coordinated with fragments of the reactive gas. Examples of reactive gases selected for coordination with the intrinsic silicon dangling bonds include hydrogen gas and fluorine gas.

Accordingly, thermally evaporated amorphous silicon generally must contain for example, hydrogen or fluorine in order to be useful as a photoconductive member. Thus, the preparation of such a material requires processes and apparatus which are vastly different from those required for the familiar thermal evaporation techniques selected for the preparation of chalcogenides.

One known method for obtaining amorphous silicon materials is referred to in the art as the glow discharge process. In this process, the vapor deposition of a silane gas occurs by causing the gas to flow between two electrodes, one of which has a substrate contained thereon. As electrical power is applied to the electrodes, the silane gas decomposes into a reactive silicon hydrogen species, which will deposit as a solid film on both electrodes. The presence of hydrogen can be of critical importance since it tends to coordinate with the dangling bonds in the silicon in part, as the mono, di, and tri-hydrides, thereby serving to passivate these dangling bonds.

In another known process, amorphous silicon can be prepared by a sputtering technique, wherein a substrate is attached to one electrode, and a target of silicon is placed on a second electrode. These electrodes are connected to a high voltage power supply and a gas which is usually a mixture of argon and hydrogen is introduced between the electrodes to provide a medium in which a glow discharge, or plasma can be initiated, and maintained. The glow discharge provides ions which strike the silicon target, and cause the removal by momentum transfer of mainly neutral target atoms, which subsequently condense as a thin film on the substrate electrode. Also, the glow discharge functions to activate the hydrogen, causing it to react with the silicon, and be incorporated into the deposited silicon film. The activated hydrogen also coordinates with the dangling bonds of the silicon to form mono, di, and trihydrides.

There is also known, as described in a copending application an apparatus and process for preparing amorphous silicon films on a substrate, which involves means for directing and accelerating an ion beam from a plasma toward a sputtering target contained within a chamber, which chamber also contains a shield means having a low sputtering efficiency compared to the sputtering target. The shield means is situated between stray ion beams and the vacuum chamber surface. More specifically, the ion beam process involves producing semiconductive films on a substrate comprising generating the plasma, directing and accelerating an ion beam of the plasma toward a sputtering target, the target being contained in a vacuum chamber at reduced pressure, shielding the vacuum chamber surface from stray ion beams, whereby sputtering of the vacuum chamber surface by the plasma is minimized, followed by sputtering the target with the ion beam to sputter the target material, collecting the sputtered target material as a film on the substrate, the substrate being physically isolated from the plasma generating process and the sputtering process.

While the latter processes may be suitable for their intended purposes, they suffer from a number of disadvantages, including for example, very low rates of material deposition, the inability to obtain uniform coatings over large areas, and the inability to form multi-layers without moving or removing the target and/or the substrate.

Additionally, there is disclosed in U.S. Pat. No. 4,265,991 an amorphous silicon photoconductor. This patent describes several processes for preparing amorphous silicon. In one process, there is prepared an electrophotographic photosensitive member which involves heating the electrophotographic member contained in a chamber to a temperature of 50° C. to 350° C., introducing a gas containing a hydrogen atom into the deposition chamber, causing an electrical discharge in the space of the deposition chamber, in which a silicon compound is present, by electric energy to ionize the gas, followed by depositing amorphous silicon on the electrophotographic substrate at a rate of 0.5 to 100 Angstroms per second by utilizing an electric discharge while raising the temperature of the substrate, thereby resulting in an amorphous silicon photoconductive layer of a predetermined thickness.

There continues to be a need for improved processes and apparatus for obtaining uniform films of photoconductive amorphous silicon at increased deposition rates over large areas. Additionally, there continues to be a need for improved processes and apparatus for preparing amorphous silicon photoconductor members, which processes and apparatus are simple in design, economically attractive, and which are susceptible to a batch operation. Moreover, there continues to be a need for processes and apparatus for preparing amorphous silicon photoconductive structures having superior mechanical strength, improved chemical stability, and substantially no toxicity problems associated therewith. Further, there continues to be a need for improved processes and apparatus for obtaining amorphous silicon photoconductors wherein the thickness of the resulting film on a substrate will be axially and radially uniform over a variety of operating conditions. Also, there continues to be a need for improved processes and apparatus for obtaining amorphous silicon photoconductors wherein virtually all the silane source gas material is converted to amorphous silicon. Additionally, there continues to be a need for improved apparatus for the deposition of amorphous silicon photoconductors, wherein the apparatus can be easily and expeditiously cleaned between depositions to avoid a buildup of material in the deposition chamber. Finally, there continues to be a need for a process and an apparatus which are suitable for the deposition of amorphous silicon and related materials on numerous cylindrical substrates contained in one deposition apparatus, such as a vacuum chamber.

SUMMARY OF THE INVENTION

It is an object of the present invention to provide an apparatus and process which overcomes some of the above-noted disadvantages.

It is a further object of the present invention to provide an apparatus and process for the plasma deposition of photoconductive silicon and silicon based materials, in a uniform thickness, and with uniform properties, on cylindrical substrates.

In a further object of the present invention there is provided an improved apparatus for preparing amorphous silicon photoreceptors.

In an additional object of the present invention there is provided an improved apparatus for obtaining amorphous silicon photoreceptor films of a uniform thickness at high deposition rates, which apparatus is simple in design and economically attractive.

In a further object of the present invention there is provided an apparatus and process for obtaining amorphous silicon films having photoconductive properties for extended periods of time, which films are obtained by introducing a source material such as silane gas into a reaction chamber containing a first or substrate electrode means, and a second or counter electrode means.

It is still an additional object of the present invention to provide an improved apparatus and process for the fabrication of multiple amorphous silicon photoconductive devices will substantially identical properties and characteristics.

These and other objects of the present invention are accomplished bythe provision of a process and apparatus for obtaining amorphous silicon photoreceptors, the apparatus being comprised of a first electrode substrate means, containing heating elements therein, a counter electrode means, a receptacle, or vacuum chamber, for housing the first electrode means, and the counter electrode means, with the first electrode means containing the substrate or workpiece which may be in the form of cylindrical member or drum and an entrance means and an exhaust means in the receptacle for a silane gas. In a variation of the apparatus of the present invention, a module consisting of a first electrode means containing heating elements therein, a second counter electrode means and a substrate contained on the first electrode means, can be arranged in a single receptacle or chamber which contains one gas inlet and one gas exhaust exit. In another embodiment of the present invention, there is provided an apparatus and process for producing amorphous silicon photoconductors wherein a plurality of drums to be coated are contained in one receptacle, thus no counter electrode is needed in this arrangement. These specific devices are described in detail hereinafter with reference to the Figures, for example.

In a further specific embodiment of the present invention there is provided a process for preparing amorphous silicon photoconductors which comprises providing a receptacle containing therein a first substrate electrode means, and a second counter electrode means, providing a cylindrical surface on the first electrode means, heating the cylindrical surface with heating elements contained in the first electrode means while causing the first electrode means to axially rotate, introducing a silane gas into the reaction vessel at a right angle with respect to the cylindrical member, applying a current to the first electrode means, applying a current to the second electrode means, whereby the silane gas is decomposed causing deposition of amorphous silicon on the cylindrical surface.

DESCRIPTION OF THE PREFERRED EMBODIMENTS

The process and apparatus of the present invention and various alternative embodiments will now be described with reference to the following Figures wherein:

FIG. 2A and 2B are schematic views of another embodiment of the apparatus and process of the present invention.

Figure 4A:
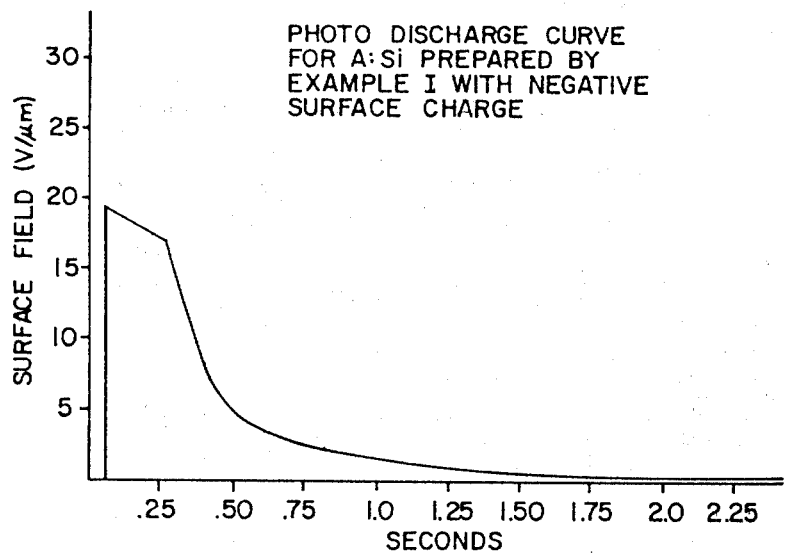
Figure 4B:
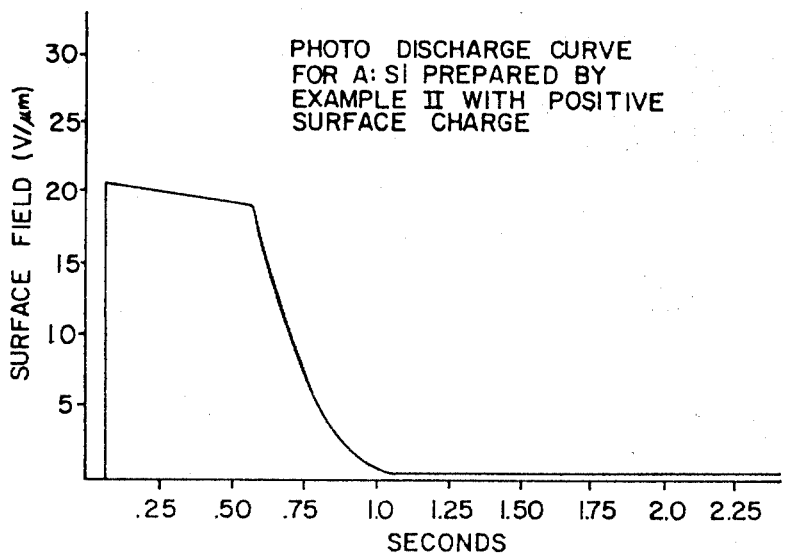

FIG. 4 contains line graphs illustrating the photoconductive properties of the amorphous silicon devices prepared in accordance with Example I, FIG. 4A, and Example II, FIG. 4B.

Figure 1:
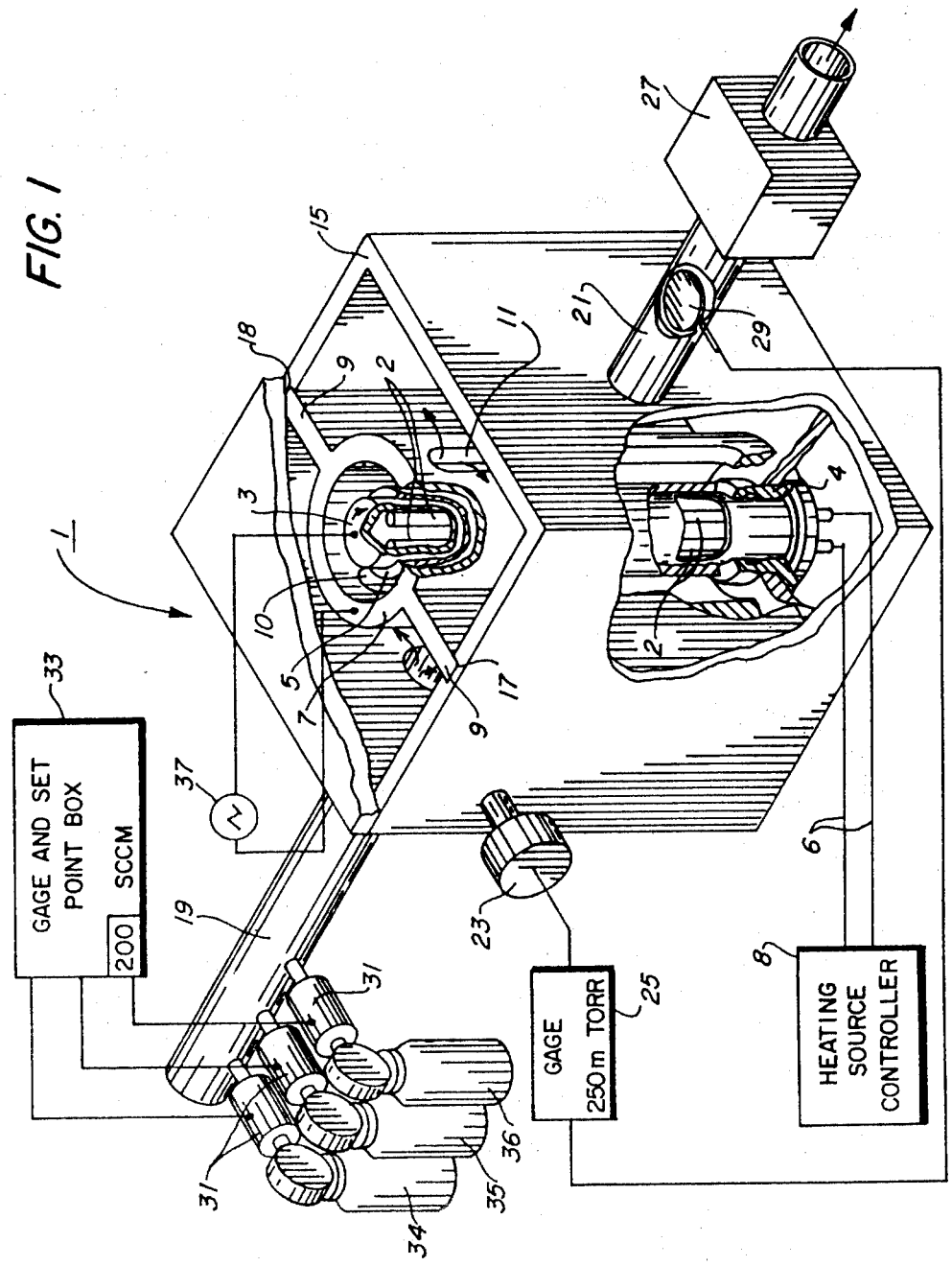
FIG. 1 is a schematic view of an embodiment of the apparatus and process of the present invention.

Illustrated in FIG. 1 is the apparatus and process of the present invention, generally designated 1, comprising a cylindrical first electrode means 3, rotating in the direction indicated by the arrow, secured on an electrically insulating rotating shaft, radiant heating elements 2 situated within the first electrode means 3, connecting wires 6, a hollow shaft rotatable vacuum feed through 4, a heating source 8, a hollow drum substrate 5, containing therein, the first electrode means 3, the drum substrate being secured by end flanges, now shown, which are part of the first electrode means 3, a second hollow counter electrode means 7, containing flanges thereon 9, and slits or vertical slots 10 and 11, receptacle or chamber means 15, containing as an integral part thereof receptacles 17 and 18 for flanges 9 for mounting the module in the chamber 15, a capacitive manometric vacuum sensor 23, a gauge 25, a vacuum pump 27, with a throttle valve 29, mass flow controllers 31, a gage and set point box 33, gas pressure vessels 34, 35 and 36, and a current source means 37, for the first electrode means 3, and the second counter electrode means 7. The chamber 15 contains an entrance means 19, for the source gas material, and an exhaust means 21 for the unused gas source material. By module in accordance with the present invention, is meant that portion of the apparatus comprised primarily of the first electrode means containing heating elements therein, and a second counter electrode means with the drum or substrate to be coated contained on the first electrode means.

Generally, in operation, the chamber 15 is vacuum evacuated by vacuum pump 27, to an appropriate pressure corresponding to the pressure desired by manually adjusting gauge 25, this pressure being measured in the chamber by the vacuum sensor 23. The pressure in the chamber 15 is automatically regulated so as to correspond to the setting specified at gauge 25 by the position of the throttle valve 29. Subsequently, a silane gas, which originates from one of the gas vessels 34, 35, or 36 is introduced into the chamber 15 through entrance means 19, the flow of the gas being controlled by the mass flow controller 31. This gas is introduced into the entrance 19 in a cross flow direction, that is the gas flows in a direction perpendicular to or at right angles to the axis of the cylindrical substrate 5 contained on the first electrode means 3. Similtaneously with the introduction of the silane gas, the first electrode means is caused to rotate by a motor, not shown, and power is supplied to the radiant heat elements 2 by heating source 8, while current is applied to the first electrode means and the second counter electrode means by a power source 37. Generally, sufficient power is applied from the heating source 8 that will maintain the drum 5 at a temperature ranging from about 100° C. to about 300° C. and preferably at a temperature of about 200° C. to 250° C. The electrical field created between the first electrode means 3 and the second counter electrode means 7, causes the silane gas entering this field to be decomposed by flow discharge, whereby amorphous silicon (a-Si:H) is deposited in a uniform thickness on the surface of cylindrical means 5 contained on the first electrode means 3. Unused silane gas exits at 21 in view of the pressure differential existing between the left side of the chamber 15 and the right side, which gas is subsequently discarded. The gauge and set point box 33 controls the amount of silane gas introduced into entrance 19, this amount generally being up to 5 liters per minute or about 2 cubic centimeters to about 200 standard cubic centimeters per minute at standard temperature and pressure operating conditions. An important purpose for slits 10 and 11 is to maintain the silane gas in a crossflow direction.

More specifically, in one operation sequence, chamber 15 is evacuated to a base pressure of less than 1 mTorr (milliTorr) and subsequently, a silane gas is introduced into the chamber 5 from gas pressure vessel 34, or a silane gas mixed with other dopant gases such as diborane or phosphine, are introduced into the chamber from gas pressure vessels 34, silane gas, 35, diborane, and 36, phosphine. Further, the silane gas can be introduced into the reaction chamber as alloy gases with ammonium or hydrocarbons as detailed herein. The flow rate of the gas being introduced is controlled by the mass flow controller 31 which flow rate is equivalent to the numerical readout specified in the gauge and set point box 33. This flow rate ranges from about 2 cubic centimeters per minute to about 5 liters per minute, normalized per module. The pressure of the silane gas or mixtures thereof in the vacuum chamber 15 is controlled as desired with the vacuum sensor 23, vacuum gauge 25, vacuum pump 27 and throttle valve 29, by setting the pressure desired at gage 25. This pressure generally ranges from 100 to about 5,000 mTorr, however, in the operational sequence being illustrated, the pressure is 250 mTorr.

The first electrode 3 is caused to rotate at a speed of from about one rotation per minute to about ten rotations per minute by a motor not shown. In this illustrative embodiment, the first electrode means 3 and the counter electrode means 7, are connected to terminals of power source 37, of direct current, alternating current radiofrequency, microwave, or the like. Thus there can be applied to the electrode 3 by direct current, a voltage of from about 10 volts to about 2,000 volts, while the counter elecrode is at ground potential, that is 0 volts. This creates an electrical field situated between the first electrode means 3 and the counter electrode means 7.

Simultaneously with the introduction of the silane gas, or mixtures thereof, into chamber 15, the drum surface 5 is heated to a temperature of about 230° C., by heating elements 2. Subsequently, the silane gas, or mixtures thereof entering the electric field in a crossflow direction is decomposed by a gas discharge or plasma resulting in silicon species, and hydrogen species, which deposit on the surface of drum 5 and on the inside of the counter electrode 7. The gas discharge or plasma formed between the two electrodes contains ions and electrons, neutral radicals, silane or silane and dopants, such as diborane and phosphorous molecules. Thereafter, and after a sufficient amount of amorphous silicon has deposited on the substrate of cylindrical means 5, the system is inactivated and the amorphous silicon coated cylindrical drum is removed from the chamber 15. Should it be desired to prepare other amorphous silicon members, there is then inserted into the chamber 15 and in contact with the first electrode means 3, an uncoated cylindrical means 5 followed by reactivation of the system described. The cylindrical coated amorphous silicon means removed from the chamber is then suitable for use as a photoconductive element in, for example, an electrostatographic imaging process.

The first electrode means 3 can be of any one of a different number of configurations, but preferably is in the form of a cylinder, with an overall length of from about 9 inches to about 20 inches, with the overall diameter being from about 3 inches to about 15 inches. Generally, this electrode means which is connected to a voltage source is a solid member comprised of numerous suitable materials such as stainless steel, steel, invar, aluminum, ceramic matrials or glassy materials, and the like, with stainless steel being preferred.

The electrode means 3 is secured to the chamber 15 by an electrically insulating shaft or a hollow shaft rotatable vacuum feedthrough 4, which is commercially available from Ferrofluids Corporation. The shaft is caused to rotate at a speed of from about 1 rotation per minute to about 10 rotations per minute, by a power source such as a motor not shown, which causes the first electrode means 3 and the cylindrical means 5 to rotate at substantially the same speed.

The first electrode means 3 is as illustrated contained in a rotatable hollow cylindrical means 5, which means is in physical contact with the first electrode means. The cylindrical drum means is secured to the first electrode means 3 by demountable end flanges situated at the top portion and bottom portion, not shown, of the first electrode means assembly. The cylindrical means 5, which provides a supporting substrate for the deposition of the amorphous silicon generated by the decomposition of the silane gas, or mixtures of silane gases, can be comprised of numerous suitable substances including aluminum, nickel, polymeric compositions, such as polyimides, stainless steel, and the like, with aluminum being preferred.

Generally, from about 0.5 micrometers per hour, to about 10 micrometers per hour of amorphous silicon are deposited on the surface of the cylindrical means 5. Other deposition rates are possible providing the objectives of the present invention are achieved, these rates being controlled by the flow rate of the silane gas introduced into the chamber 15, and by the electrical power supplied to the electrodes.

The amorphous silicon is generally deposited on the cylindrical drum means 5 in a thickness of from about 5 microns to about 60 microns, and preferably in a thickness of from about 20 microns to about 30 microns. The amorphous silicon deposited contains from about 5 weight percent to about 35 weight percent of hydrogen, and from about 65 weight percent to about 95 weight percent of silicon, together with in some instances, small amounts of appropriate dopants, such as boron and phosphorous.

The first electrode means 3 and cylindrical drum means 5, are contained in a hollow second electrode means 7 comprised of for example, stainless steel, containing flanges thereon. Generally, the second electrode means has a length of from about 9 inches to about 20 inches and has a diameter of from about 4 inches to about 16 inches. Electrodes with other size ranges can be selected providing the objectives of the present invention are achieved, the size of this electrode being dependent, for example, on the dimensions of the first electrode and the dimensions of the cylindrical drum means 5. The flanges 9, which extend for the entire length of the second counter electrode means 7, are permanently attached thereto, the primary purpose of these flanges being for securement of the module to the chamber means 15. Also, as these flanges are mounted in the entrance slots 17, they function to retain the gas source in the vacuum chamber as illustrated.

The flow of the silane gas source is an important parameter of the present invention, this flow being specified herein as a crossflow. This crossflow direction provides for the uniform deposition of amorphous silicon in essentially an identical thickness on the entire drum surface since radial thickness uniformity is warranted by drum rotation and axial thickness uniformity is a result of the axially uniform gas flow pattern.

The silane gas entering into the reaction chamber is decomposed by the field established between the first electrode means, and the second counter electrode means. This field is established as a result of the connection of the terminals of an electrical power supply to the first and second electrode. This power supply may be of the direct current type or the alternating current type with a frequency from 0 to about microwave frequencies. The second electrode means can be at the same electrical potential as the chamber means 15.

The electric field contained between the electrodes ranges from about 10 volts/inch to about 10,000 volts/inch and preferably is from about 250 volts/inch to about 1,500 volts/inch, however, this field can be varied as desired, providing the objectives of the present invention are accomplished.

The chamber means 15 serves as a container for the module and is generally comprised of stainless steel sealed with demountable covers which serve as access means. This container is of a sufficient dimension so as to allow the module to reside therein. Generally, the container is of a height of from about 10 inches to about 30 inches, and has a width of from about 5 inches to about 17 inches.

The gas inlet entrance means 19 allows for the introduction of for example the silane gas to be decomposited, this gas originating from a cylinder. Examples of such gases include $SiH_4$ and $Si_2H_6$. Additionally, the selected hydrosilicon gas may be mixed with doping materials such as diboran, $B_2H_6$ originating from gas vessel 35, and/or phosphine, $PH_3$ originating from gas vessel 36, added in amounts ranging from about 1 part per million to about 100 parts per million, by volume. The borane dopant is for the primary purpose of producing a p-type material, while the phosphine gas allows the production of an n-type material.

Additionally, the gas is introduced in a crossflow direction at approximately a 90° angle relative to the cylindrical drum being coated. Another inlet may be provided for the introduction of other gases including oxygen or nitrogen, water vapor or hydrocarbon gases, or a combination of these gases with the introduction of $SiH_4$, $Si_2H_6$, for the purpose of improving the properties of the deposited layer. Thus, the photosensitivity and dark discharge properties of the deposited amorphous silicon can be improved with the addition of these other gases.

Moreover, in accordance with the process and apparatus of the present invention there can be prepared layered members such as those members comprised of amorphous silicon containing thereover a coating of silicon nitride or silicon carbide. This is accomplished by initially depositing amorphous silicon on the cylindrical drum surface 5, followed by the deposition of silicon nitride by introducing a mixture of a silane gas with ammonia in a ratio of 1 part silane gas to about 3 parts of ammonia, followed by the deposition of silicon carbide from mixtures of silane and methane, or silane and ethylene. The thickness of the second layer, the silicon nitride or silicon carbide layer, ranges from about 0.1 microns to about 1.0 microns.

Figure 2A:
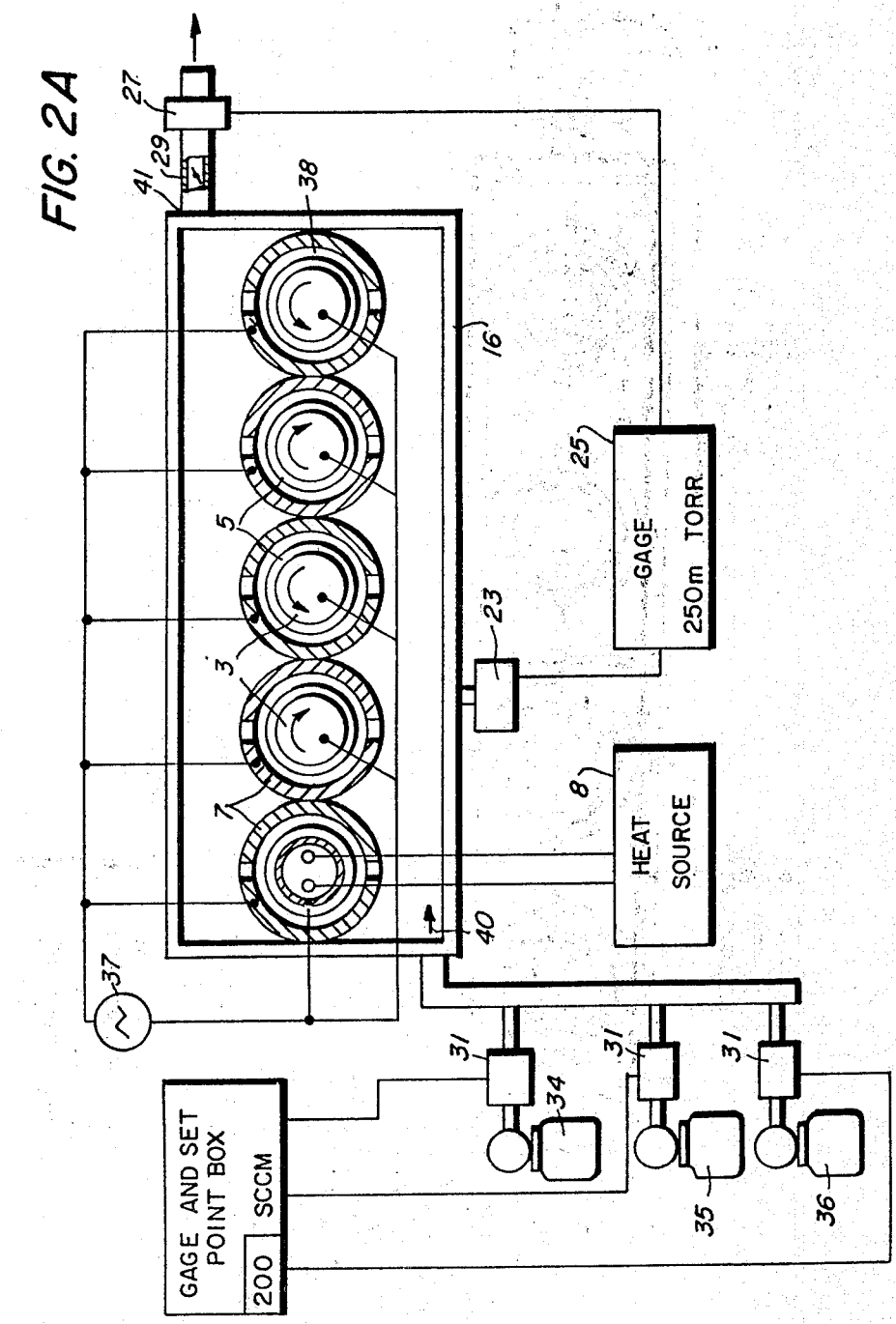

Illustrated in FIG. 2 is a further embodiment of the apparatus and process of the present invention with modules either in series, reference FIG. 2A or parallel, reference FIG. 2B, which modules are contained in one reaction chamber 16. More specifically, there is illustrated in FIG. 2 a series of modules or modules in parallel, comprised of a first electrode means 3, a cylindrical drum 5, a counter electrode means 7, containing flanges 9 thereon and slits therein, 10 and 11. The devices as illustrated in FIGS. 2A and 2B contain other components identical to the components in FIG. 1, including a vacuum sensor 23, gage 25, vacuum pump 27, throttle valve 29, mass flow controller 31, gage and set point box 33, electrical power source 37, radiant heating elements 2, wires 6, hollow shaft rotatable vacuum feedthrough 4, heating source 8, gas pressure vessels, 34, 35, and 36, and exhaust means 41. There is further illustrated in these figures, electrical field 38.

With further reference to FIGS. 2A and 2B, amorphous silicon is deposited on the rotating cylindrical drum surfaces 5 in accordance with the details provided herein with reference to FIG. 1. The apparatus as illustrated in FIGS. 2A and 2B, numerous cylindrical drums to be coated simultaneously when silane gas, or a mixture of silane gas with other gases is introduced into the chamber 15 through entrance means 39. The flow rate of the silane gas introduced into the chamber 15 is the flow rate per module as described with reference to FIG. 1 multiplied by the number of modules present in the container 15, thus the flow rate of the silane gas for coating the five modules as illustrated in FIG. 2 would be approximately 1,250 standard cubic centimeters per minute.

Figure 3:
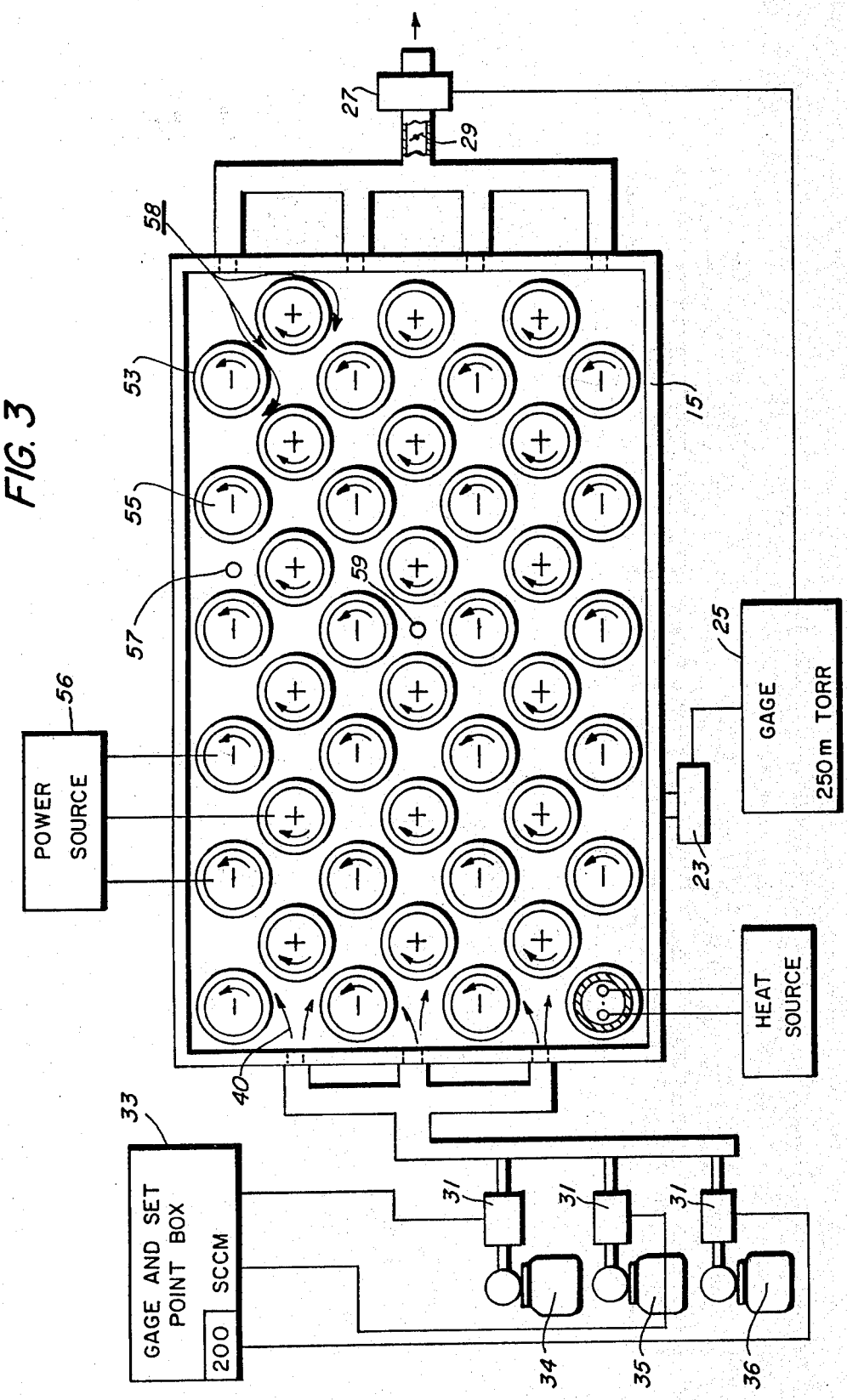
FIG. 3 is a schematic view of a further embodiment of the apparatus and process of the present invention.

It is important to emphasize that as is the situation with the apparatus of FIG. 1, silane gas is directed in a crossflow direction, perpendicular to the drum substrate, being coated as illustrated by the arrows 40 depicting the flow of the silane gas. One advantage of the apparatus of FIG. 2 in comparison to FIG. 1 is that a series of drums can be coated simultaneously with the apparatus of FIG. 2 while only one drum may be coated with the apparatus of FIG. 1. Nevertheless, the time needed for causing deposition of the coating on the drum in FIG. 1 is substantially equal to the amount of time for coating the drum of FIG. 2B, since the amount and degree of coating can be controlled by altering the flow rate of the gas. Thus, in FIG. 2B, where the modules are shown in parallel, the flow rate of the gas into the vacuum chamber is substantially the same as in the case of a single module, but multiplied by the number of modules incorporated in the vacuum chamber. In FIG. 2A, where modules are shown in series, the flow rate of the gas into the vacuum chamber is substantially the same as in the situation with a single module. In the latter situation, the efficiency of the conversion of the reactive silane gas into a photoconductive material has been substantially improved. Illustrated in FIG. 3, is a further embodiment of the present invention wherein a counter electrode is not required. In this Figure, there is illustrated cylindrical drums 53 and 55, equivalent to cylindrical drum means 5 of FIG. 1, which are initially subjected to an electrical potential, from power source 56, in such a manner so as to result in alternating positive and negative potentials on the cylindrical drum surfaces as illustrated. Although not shown, wires are connected from the power source 56 to each cylinder. These potentials can be continuously altered during the process, thus, for example the cylindrical drums containing positive charges thereon are converted to cylindrical drums containing negative charges thereon, while cylindrical drums with negative charges thereon are converted to cylindrical drums with positive charges thereon by the electrical source 56. In one embodiment, the electrical polarity of the cylindrical drums is altered by the use of alternating current sources, originating from 56, with frequencies of from 0.01 Hertz to radio frequencies of about 50 megahertz. There is thus created essentially two electrodes comprised of the cylindrical drums to be coated which creates an electrical field in the reaction chamber 17, allowing for the decomposition of the silane gas injected into the chamber in a crossflow direction as detailed herein with reference to FIG. 1.

The apparatus of FIG. 3 also include other components identical to the components as described with reference to FIG. 1 including a vacuum sensor 23, a gauge 25, vacuum pump 27, throttle valve 29, mass flow controller 31, gauge and set point box 33, radiant heat elements 2, wires 6, a hollow shaft rotatable vacuum feedthrough 4, heating source 8, and gas cylinders 34, 35 and 36. Although not shown there is a heating source for each cylinder. There is also illustrated in this Figure, electrical fields 58. In operation, the apparatus as described in FIG. 3 functions in substantially an identical manner with regard to the functioning of the apparatus illustrated in FIGS. 1 and 2 in that a silane gas, or a mixture of silane gases with other gases is introduced into the receptacle 17 in a crossflow direction 40, and this gas is caused to decompose in view of the electrical field present between each of the cylindrical drums.

The chamber 17 can include a number of gas inlets, designated in FIG. 3 as optional inlets 57 and 59. These additional inlets function to provide superior and more rapid deposition of the amorphous silicon on the drum surfaces. Containers can be envisioned which will include therein numerous cylinders or drums to be coated with the number of drums to be coated being restricted only by the dimensions placed on the reaction chamber. Thus, for example, it is envisioned that perhaps up to 1,000 drums can be coated simultaneously in such a chamber.

The coated cylindrical drums prepared in accordance with the process and apparatus as illustrated with reference to FIGS. 1,2 and 3, for example, contain photoconductive amorphous silicon as evidenced by X-ray diffraction, and selected area electron diffraction characterizations. Further, xerographic charging and photodischarge tests indicated that the cylindrical drums contained photoconductive amorphous silicon. In these tests, a surface charge is applied by a corona discharge in air, to the coated cylindrical drum surface, in order to create an electric field of about 20 volts/micron, or greater across the amorphous silicon film. This surface charge, which is either of a positive or negative polarity can be erased by illumination. Specifically, it was determined by analytical analysis with secondary ion mass spectroscopy that the deposited thin films contain mainly silicon, 95 percent by weight to 65 percent by weight, and hydrogen 5 percent by weight to 35 percent by weight. Also, with electron spin resonance techniques, the paramagnetic spin density of the amorphous silicon can be measured, which density is believed to be a measure of the density of dangling or unsatisfied bonds. The measured spin density was in the order of $10^{15}$ to $10^{17}$ cm$^3$.

With reference to FIG. 4, there is illustrated two curves, identified as curve A and curve B. In curve A there is shown the photoconductivity, for example, of the amorphous silicon device made in accordance with Example 1. More specifically, curve A represents a photodischarge curve for the amorphous silicon device prepared in accordance with Example 1. There is specifically plotted in FIG. 4A the surface field potential in volts per micron as the Y axis, of the amorphous silicon device prepared in accordance with Example 1, which potential is measured with an electrostatic surface probe. The surface field is measured at the intervals in seconds shown on the X axis, thus, for example, the surface potential decreased from 20 to about 18 after about 0.30 seconds. Subsequently, the device was subjected to white light of 15 ergs/cm$^2$, with a wavelength 4,000 to 7,000 Angstrom units, wherein the surface field was reduced substantially to zero indicating complete discharge of the device. Complete discharge in turn indicates photoinduced conductivity or photoconductivity for the amorphous silicon device prepared in accordance with Example I.

Curve B represents a similar plot for the amorphous silicon device prepared in accordance with Example II. As illustrated, the surface potential of the device decreases from about 20 to about 19 in 0.60 seconds. Subsequently, the device was subjected to white light of 15 ergs/cm$^2$, with a wavelength 4,000 to 7,000 Angstrom units wherein the device completely discharged, which indicated photoinduced conductivity, or photoconductivity for the amorphous silicon device prepared in accordance with Example II.

Furthermore, the amorphous silicon drums made in accordance with the process of the present invention were incorporated into xerographic imaging systems wherein the drums functioned as a photoconductor. These drums were charged to a positive polarity, exposed to an optical image pattern, followed by developing the electrostatic latent image with a developer composition comprised of toner particles and carrier particles. The resulting images were then transferred to a suitable substrate and permanently affixed thereto by heat. The resulting developed images were of excellent resolution, low background, high line density, and excellent solid area coverage.

The invention will now be described in detail with respect to specific preferred embodiments thereof, it being understood that these Examples are intended to be illustrative only and the invention is not intended to be limited to the materials, conditions, process parameters, recited herein. All parts and percentages are by weight unless otherwise indicated.

EXAMPLE I

The apparatus of FIG. 1 was evacuated to pressures of less than $1 \times 10^{-4}$ Torr, and the combined inleak and outgassing rate was typically smaller than 0.1 standard cubic centimeter per minute. Nitride grade silane gas, available from Air Products, Airco, was introduced in the apparatus in a crossflow direction, at a flow rate of 200 standard cubic centimeter per minute. The Roots/-mechanical pump combination of the apparatus was throttled so as to produce a pressure of 250 mTorr at these flow rates. The pressure was held constant by a closed loop pressure control apparatus situated between the capacitance manometer and the throttle valve. Discharge was initiated in the annular space situated between a first stainless steel electrode, and a second steel electrode counter electrode, by applying a DC voltage of about 750 volts to these electrodes, causing the first electrode, containing an aluminum drum to have a negative polarity with respect to the second counter electrode which is grounded. The distance between the first electrode and the second electrode was about 1 inch.

Power was then supplied to the heating elements contained in the first electrode in order to maintain the temperature of the cylindrical aluminum drum to be coated at 230° C. Additionally, the first electrode containing the aluminum cylinder thereon was rotated by an external motor drive at a speed of 1–2 revolutions per minute. The cylindrical aluminum drum being coated has a surface area of about 1,000 cm$^2$, thus the current drawn is about 100 milli-amperes which was held constant throughout the deposition process.

A total deposition time of 3 hours results in a uniform deposit of amorphous silicon on the aluminum drum the thickness of which was more than 20 microns. The deposition was terminated by turning off the supply voltage and closing the gas valves.

The amorphous silicon aluminum drum thus prepared was incorporated into a xerographic imaging system wherein there was formed on the imaging member an electrostatic latent image. This image was then developed with a developer composition comprised of resin particles containing a styrene n-butylmethacrylate resin, 90 percent by weight and 10 percent by weight of carbon black, and there results excellent images. Specifically xerographic prints made with such a drum have good contrast, good line resolution and good solid area coverage.

The coated drum accepts negative charge causing an electrical field of 20 volts per micron in the silicon film and discharges with white light of 15 ergs/cm$^2$, with a wavelength of 4,000 to 7,000 Angstroms, in that no measurable charge remained thereon after a discharge time of about 1.25 seconds as determined by an electrostatic probe.

EXAMPLE II

The procedure of Example I was repeated with the exception that there was introduced into the apparatus at a flow rate of 200 cubic centimeters per minute a mixture of a silane gas and diborane, at 4 parts per million by gas volume, resulting in an aluminum drum coated with amorphous silicon doped with diborane, this coating being of a thickness of 20 microns after 3 hours of deposition.

The resulting coated aluminum drums were then charged with a corona discharge of positive polarity to an electric field of 20 volts per micron, followed by being discharged with white light of positive polarity at an intensity of 15 ergs/cm$^2$. This was evidence that the drums charge and photodischarge in that no charge after photodischarge remained on the drum after 1 second as determined by an electrostatic probe.

The coated aluminum drum was then incorporated into a xerographic imaging system wherein there was formed a positive electrostatic latent image on the surface of the boron doped amorphous silicon diborate coating, followed by developing this image with toner particles comprised of a styrene n-butylmethacrylate copolymer resin, 90 percent by weight, and carbon black, 10 percent by weight. These images were then transferred to paper and permanently affixed thereon by heat. The resulting images had good contrast, excellent line resolution, and superior solid area coverage.

EXAMPLE III

There was prepared an amorphous silicon photoreceptor drum containing thereon a coating of silicon nitride, by repeating the procedure of Example I with the exception that these was first introduced into the apparatus of FIG. 1, at a flow rate of 200 cubic centimeters per minute, silane gas SiH$_4$, with 4 parts per million of boron hydride, B$_2$H$_6$, at a pressure of 250 m Torr, resulting in a doped amorphous silicon coating on the aluminum drum in a thickness of 20 microns, when this process was continued for 3 hours.

Subsequently, there was introduced into the reaction chamber of FIG. 1, for a period of 10 minutes, ammonia, at a flow rate of 150 standard cubic centimeters per minute, and silane gas, SiH$_4$, at a flow rate of 50 standard cubic centimeters per minute. There results a silicon nitride coating in a thickness of 7500 Angstrom units, overcoated on the amorphous silicon material.

The resulting photoresponsive member, containing amorphous silicon deposited on aluminum drum, and a layer of silicon nitride deposited on the amorphous silicon was incorporated into a xerographic imaging device wherein there is formed on the amorphous silicon photoconductor a positive electrostatic latent image. This image was then developed with toner particles comprised of a styrene n-butylmethacrylate resin, 88 percent by weight, carbon black, 10 percent by weight, and 2 percent by weight of the charge enhancing additive cetyl pyridinium chloride. The resulting developed image was then transferred to paper and permanently affixed thereon by heat. There resulted as determined by visual observation images of good contrast, excellent line resolution, and good solid area coverage.

EXAMPLE IV

The procedure of Example I was repeated with the exception that the drum was held at a positive potential of about 750 volts during deposition and there was introduced into the apparatus at a flow rate of 200 cubic centimeters per minute a mixture of a silane gas and diborane, at 4 parts per million by gas volume, resulting in an aluminum drum coated with amorphous silicon doped with diborane, this coating being of a thickness of 6 microns after 3 hours.

The resulting coated aluminum drums are charged with a corona discharge of positive polarity to an electric field of 20 volts per micron, followed by being discharged with white light of positive polarity at an intensity of 15 ergs/cm$^2$, which indicated the drums charge and discharge, and further no charge after discharge remained on the drum after 1 second as determined by an electrostatic probe.

The coated aluminum drum was then incorporated into a xerograhic imaging system wherein there is formed a positive electrostatic latent image on the surface of the amorphous silicon diborate coating, followed by developing this image with toner particles comprised of a styrene n-butylmethacrylate copolymer resin, 90 percent by weight, and carbon black, 10 percent by weight. These images were then transferred to paper and permanently affixed thereon by heat. The resulting images had good contrast, excellent line resolution, and superior solid area coverage.

EXAMPLE V

The procedure of Example IV is repeated with the exception that radial frequency power is applied to the first electrode with a matching network, with the radial frequency power level power being 100 watts at a frequency of 13.56 megaHertz, and there was introduced into the apparatus at a flow rate of 200 cubic centimeters per minute a mixture of a silane gas and diborane, and 4 parts per million by gas volume, resulting in an aluminum drum coated with amorphous silicon doped with diborane, this coating being of a thickness of 6 microns after 3 hours.

The resulting coated aluminum drums are changed with a corona discharge of positive polarity to an electric field of 20 volts per micron, followed by being discharged with white light of positive polarity at an intensity of 15 ergs/cm$^2$. This is evidence that the drums charge and discharge, and that they accepted positive charge. Further no charge after discharge remained on the drum after 1 second as determined by an electrostatic probe.

The coated aluminum drum was then incorporated into a xerographic imaging system wherein there is formed a positive electrostatic latent image on the surface of the amorphous silicon diborate coating, followed by developing this image with toner particles comprised of a styrene n-butylmethacrylate copolymer resin, 90 percent by weight, and carbon black, 10 percent by weight, no charge control additive. These images were then transferred to paper and permanently affixed thereon by heat. The resulting images had good contrast, excellent line resolution, and superior solid area coverage.

EXAMPLE VI

An amorphous silicon photoconductor was prepared by repeating the procedure of Example I with the exception that the flow rate of the gas was 50 standard cubic centimeters per minute. This results in substantially improved gas usage rates at the slight detriment of deposition rates.

EXAMPLE VII

This Example pertains to the preparation of amorphous silicon drums with the apparatus illustrated in FIGS. 2A and 2B, wherein with reference to FIG. 2A two rows of drums in series were selected, while with reference to FIG. 2B 50 parallel drums in a row were selected.

Each of the apparatus were evacuated to pressures smaller than $1 \times 10^{-4}$ Torr and the combined inleak and outgassing rate was smaller than 0.1 sccm. Silane gas in a crossflow direction was introduced into the apparatus at a flow rate of 10 slm (=standard liters per minute). The vacuum pumps were throttled to produce a pressure of 250 mTorr. The discharge in the annular volumes between the electrodes in each apparatus was initiated by applying a negative DC voltage of 750 volts to the first electrodes on which the aluminum drums were mounted, these drums being rotated at speeds of 1-2 rpm. Typical currents drawn under these conditions were about 10 amperes, which current can be delivered by a commercial DC power supply as fabricated by Airco Temescal and Varian.

There results with each of the apparatuses photoconductive amorphous silicon drums, coating thickness 20 microns, which were tested for photoconductivity in accordance with the procedure of Example V with substantially similar results.

EXAMPLE VIII

This example illustrates the preparation of amorphous silicon photoconductive drums with the apparatus as illustrated in FIG. 3 as follows:

A matrix of 10 (short end) by 20 (long end) vertical shafts were placed in a stainless steel vacuum container of inside dimensions 50"×100" for top and bottom and 75" high. The top and sides of the vacuum container can be lifted off the base plate, on which the rotary feedthroughs for the shafts are mounted, exposing the shafts for drum loading and unloading purposes. A total of five drums are contained on one shaft and the shafts were rotated by means of motor, external to the vacuum system, with the power transmission train primarily consisting of identical gears mounted on each shaft. The apparatus was evacuated to pressures smaller than $1 \times 10^{-4}$ Torr and the combined inleak and outgassing rate was smaller than 1 sccm after prolonged pumping.

Silane gas, in a crossflow direction, doped with 5 ppm diborane was introduced through a multitude of evenly distributed openings at one of the 50"×75" sides of the container and through other openings in the top and baseplate of the deposition apparatus. The doped silane gas was exhausted through a 30" diameter exhaust, the center of which coincides with the center of the other 50"×75" side. The flowrate through the different openings were adjusted so as to produce a uniform deposition of silicon over all the drums. The total flow of active gas was typically 100 slm and was adjusted so as to produce a pressure of 250 mTorr in the center of the vacuum chamber. The discharge was initiated by the application of 100 kilowatts to the drums, half of the shaft having a positive polarity, and the remainder of the shaft having a negative polarity in an alternating manner as shown in FIG. 3. The spacing of the drums was about 1" at the circumference and the substrate temperature was held constant at 230° C. The polarity of the voltage applied to each shaft was changed every minute during the deposition cycle.

A total deposition time of 3 hours results in a uniform deposit of doped amorphous silicon, the thickness of which was 20 microns. Deposition was terminated by turning off the supply voltage and closing the gas valves.

The amorphous silicon aluminum drums thus prepared were incorporated into a xerographic imaging system wherein there was formed on the imaging member an electrostatic latent image. This image was developed with the developer composition comprised of resin particles containing a styrene n-butylmethacrylate resin, 90 percent by weight, 10 percent by weight of carbon black, and there resulted excellent images. Xerographic prints made with such drums have good contrast, good line resolution and good solid area coverage.

The coated drums prepared accept negative charges causing an electrical field of 20 microns in the silicon film, and these drums discharged with white light of 15 ergs/cm². No measurable charge remained after a discharge time of one second as determined by an electrostatic probe.

The process parameters and apparatus components for the devices of FIGS. 2A, 2B and 3, are substantially equivalent to those as described for FIG. 1.

Other modifications of the present invention will occur to those skilled in the art based upon a reading of the present disclosure. These are intended to be included within the scope of this invention.

We claim:

1. An apparatus for preparing amorphous silicon photoconductive devices comprising in operative relationship a rotating first electrode means, with radiant heating elements situated therein, a heating source, a hollow cylindrical drum member, containing therein the first electrode means, a second hollow counter electrode means, containing verticle slits therein, a chamber means with gas inlet means, and gas exhaust means, containing the first and second electrode means therein, a vacuum sensor means, a gauge means, a vacuum pump, a mass flow controller means, a gauge and set point box means, a power source means for the first electrode means and the second counter electrode means, and gas pressure vessels, wherein a silane gas is introduced into the chamber means in a crossflow direction perpendicular to the axis of the cylindrical member.

2. An apparatus in accordance with claim 1 wherein the heating source supplies sufficient power for maintaining the cylindrical member substrate at a temperature ranging from about 100° C. to about 300° C.

3. An apparatus in accordance with claim 1 wherein the silane gas is introduced into the chamber at a rate of up to 5 liters per minute.

4. An apparatus in accordance with claim 1 wherein the silane gas is introduced into the chamber at a rate ranging from about 2 standard cubic centimeters per minute to about 200 standard cubic centimeters per minute.

5. An apparatus in accordance with claim 1 wherein the pressure of the silane gas introduced into the chamber ranges from about 100 mTorr to about 5,000 mTorr.

6. An apparatus in accordance with claim 1 wherein the power source supplies direct current, alternating current, radio frequency current, or microwave current.

7. An apparatus in accordance with claim 6 wherein the current applied to the first electrode means ranges from about 10 volts to about 2,000 volts, while the counter electrode means is at ground potential.

8. An apparatus in accordance with claim 1 wherein the electrical field created between the first electrode means and the second counter electrode means causes deposition of the silane gas introduced into the chamber.

9. An apparatus in accordance with claim 8 wherein the electrical field contained between the electrodes ranges from about 10 volts/inch to about 10,000 volts/inch.

10. An apparatus in accordance with claim 1 wherein the amorphous silicon is deposited on the cylindrical member in a thickness of from about 5 microns to about 60 microns.

11. An apparatus in accordance with claim 1 wherein the amorphous silicon deposited contains from about 5 weight percent to about 35 weight percent of hydrogen and from about 65 weight percent to about 95 weight percent of silicon.

12. An apparatus in accordance with claim 1 wherein the first electrode means is comprised of stainless steel, steel, invar, aluminum, ceramic materials, or glassy materials.

13. An apparatus in accordance with claim 1 wherein the cylindrical member means is comprised of aluminum, nickel, polymeric compositions, or stainless steel.

14. An apparatus in accordance with claim 1 wherein there is further introduced into the chamber means a dopant gase simultaneously with the introduction of the silane gas.

15. An apparatus in accordance with claim 14 wherein the dopant gasses are borane or phosphine.

16. An apparatus in accordance with claim 15 wherein the dopant gasses are added in amounts ranging from about 1 part per million to about 100 parts per million.

17. An apparatus for preparing amorphous silicon photoconductive devices which comprises a chamber means, containing therein a series of modules comprised of a first rotating electrode means, containing therein heating elements, which means is situated within a hollow cylindrical member means, a second counter electrode means, a vacuum sensor, a pressure gauge, a mass controller means, a set point box means, gas cylinders, inlet means and exhaust means for the chamber means, and a power source means for the first electrode means, and the second counter electrode means, wherein a silane gas is introduced into the chamber means in a crossflow direction relative to the cylindrical member substrate, and whereby the gas is decomposed by the electrical discharge situated between the first electrode means and the second electrode means, causing amorphous silicon to deposit on the substrate of the cylindrical member.

18. An apparatus for preparing amorphous silicon photoconductive materials which comprises in operative relationship a chamber means, a series of rotating electrode means with alternating positive and negative potentials, a voltage source means for the electrode means, an entrance means, an exhaust means, a mass flow controller means, a sensor means, a gauge and set point box means, and gas cylinders, wherein a silane gas is introduced into the chamber means in a crossflow direction, relative to the electrode means, and whereby the gas to be decomposed in the field situated between the electrode means, causing amorphous silicon to simultaneously deposit on each of the electrode means.

19. An improved apparatus in accordance with claim 18 wherein the first electrode means is comprised of stainless steel, the second electrode means is comprised of stainless steel, and the first electrode means is rotating in a clockwise direction.

20. An improved apparatus in accordance with claim 18 wherein a silane gas is introduced into the chamber means in an amount of from about 2 standard cubic centimeters per minute to about 5 liters per minute.

21. An improved apparatus in accordance with claim 18 wherein the amorphous silicon formed contains from about 65 percent by weight to 95 percent by weight of silicon, and from about 5 percent by weight to 35 percent by weight of hydrogen.

22. An improved apparatus in accordance with claim 18 wherein the electrical field contained between the first electrode means and second electrode means ranges from about 10 volts/inch to about 10,000 volts/inch.

* * * * *